United States Patent [19]
Rey

[11] Patent Number: 6,154,599
[45] Date of Patent: Nov. 28, 2000

[54] SUPERCONDUCTING WIRES FABRICATED USING THIN OPTICAL FIBERS

[75] Inventor: Christopher M. Rey, 651 Valley Rd., Hockessin, Del. 19707

[73] Assignee: Christopher M. Rey, Hockessin, Del.

[21] Appl. No.: 09/097,797

[22] Filed: Jun. 16, 1998

[51] Int. Cl.$^7$ .............................. G02B 6/00; H01B 12/00
[52] U.S. Cl. ........................ 385/141; 174/125.1; 505/183
[58] Field of Search ................................. 385/100–103, 385/123, 126–128; 174/125.1; 333/99 S; 427/162, 163.1, 163.2; 505/183, 704

[56] References Cited

U.S. PATENT DOCUMENTS

| | | | |
|---|---|---|---|
| 4,842,366 | 6/1989 | Sawada et al. | 350/96.3 |
| 5,106,825 | 4/1992 | Mandigo et al. | 505/1 |
| 5,270,296 | 12/1993 | Hed | 505/1 |
| 5,665,628 | 9/1997 | Summerfelt | 438/3 |
| 5,932,523 | 8/1999 | Fujikami et al. | 505/231 |

FOREIGN PATENT DOCUMENTS

| | | |
|---|---|---|
| 03114011 | 5/1991 | Japan . |
| 3-114011 | 5/1991 | Japan . |

*Primary Examiner*—John D. Lee
*Assistant Examiner*—Michelle R. Connelly-Cushwa

[57] ABSTRACT

This patent application relates to the use of thin high temperature fibers, specifically optical fibers, for use as a substrate material in the fabrication of long-length low temperature superconducting and high temperature superconducting wire. The superconducting material is deposited on the fiber using either a thin or thick film deposition technique. The fiber can have a dual use in the transmission of data using either traditional optical means or the transmission of electrical current via the deposited superconductor. A buffer layer or layers is used between the high temperature fiber and the superconductor to promote grain alignment and enhance the current carrying capacity of the wire.

9 Claims, 4 Drawing Sheets

SUPERCONDUCTING WIRES FABRICATED USING THIN OPTICAL FIBERS

BACKGROUND—FIELD OF INVENTION

This invention relates to the use of a high temperature fiber, specifically an optical fiber, for use as a substrate material in the fabrication of long length low temperature superconducting and high temperature superconducting wire using thin and thick film deposition techniques.

BRIEF DESCRIPTION OF FIGURES

FIG. 1 shows a typical embodiment of the proposed invention. A noble metallic coating can be deposited to improve the superconducting grain growth as well as improve the electrical and thermal stability of the superconducting wire itself. To further improve the expitaxial growth of the superconducting material and hence improve the current carrying capacity, an appropriate crystalline buffer layer(s) can be deposited on the optical fiber. Finally, an appropriate dielectric coating can be deposited in order to provide electrical insulation and environmental protection.

FIG. 2 shows a typical embodiment of a HTS/LTS thin film deposition technique using ion beam assisted deposition (IBAD) on the proposed optical fiber substrate. The deposition beam bombards the various targets consisting of various buffer layers and HTS or LTS material. The orientation angle of the optical fiber substrate relative to the ion assist beam is adjusted to its optimal position.

FIG. 3 shows a typical embodiment of a HTS/LTS thin film deposition technique on the proposed optical fiber substrate. The optical fiber billet is either pulled, dipped, sprayed, coated etc. in a solution containing the appropriate buffer layer(s) and subsequently coated with HTS/LTS material. The optical fiber is then annealed to form the proper superconducting phase. A metallic coating and/or dielectric coating can then be applied to the optical fiber. Finally, the now superconducting fibers themselves can be re-stacked to form a superconducting billet, which can be transposed to form a superconducting cable.

FIG. 4 is a typical flow chart of HTS/LTS thin or thick film deposition on the proposed optical fiber substrate. The purpose of this figure is to further clarify the information provided in FIGS. 2 and 3.

BACKGROUND—DESCRIPTION OF PRIOR ART

General

Figure 1:
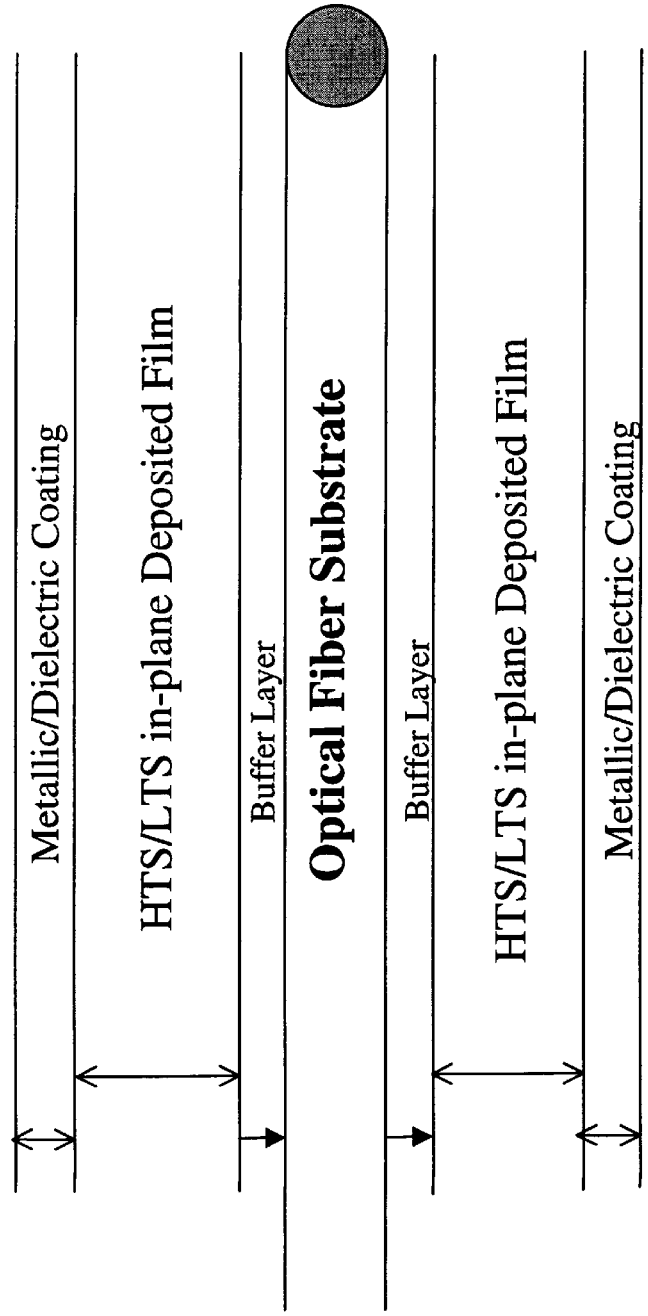
FIG. 1

Copper, aluminum, and magnetic iron are the primary materials of devices used in today's power sector. The challenge is to make practical, economic superconducting wire. With the recent discovery of High Temperature Superconductivity (HTS)[1] many approaches have been tried to fabricate long length (several km per billet) wire and tapes suitable for large-scale applications. Such applications may include (but are not limited to): ac transmission cables, motors, magnets, transformers, energy storage devices, etc. The most common of these long length wire approaches still vigorously studied and developed today include: Powder-In-Tube (PIT), Rolling, Assisted Bi-axially Textures Substrates (RABITS), and Ion Beam Assisted Deposition (IBAD). The technical problem with these approaches is simple to state: HTS material is a ceramic—it is weak, brittle and costly to prepare.

| Nomenclature Used in Text | |
|---|---|
| CVD | Chemical Vapor Deposition |
| HTS | High Temperature Superconductor |
| IBAD | Ion Beam Assisted Deposition |
| LTS | Low Temperature Superconductor |
| PIT | Powder-in-Tube |
| Re | Rare Earth |
| RF/DC | Radio Frequency/Direct Current |
| RABITS | Rolling Assisted Bi-axially Textured Substrates |

[1]High temperature superconductivity described here is any material which superconducts above 23 K. Similarly, low temperature superconductivity described here is any material which superconducts and 23 K. and below.

| Symbols Used in Text | |
|---|---|
| Ag | Silver |
| Al | Aluminum |
| Ba | Barium |
| Bi | Bismuth |
| Ca | Calcium |
| Ce | Cerium |
| Cu | Copper |
| Ge | Germanium |
| Hg | Mercury |
| La | Lanthanum |
| Nb | Niobium |
| O | Oxygen |
| Pb | Lead |
| Ru | Ruthenium |
| Sn | Tin |
| Ta | Tantalum |
| Ti | Titanium |
| Tl | Thallium |
| Y | Yttrium |
| Z | Zirconia |

Bi-Oxide Conductors

The PIT method has been primarily limited to the Bi-oxide family because of its superior texturing properties. However, there are many disadvantages to the PIT approach. The primary disadvantages are economics and operating parameters. The PIT method is expensive to fabricate and manufacture (estimates are as high as $100 to 2000 per kA-m). An underlying problem with this approach is the use of silver or silver alloys as its containment medium. These materials are expensive relative to the ultimate cost of the wire. Another problem with the PIT approach is the relatively long processing time required fabricating the material. The major obstacle to the PIT method is the Bi-oxide material itself. The practical use of the Bi-oxide material appears to be intrinsically limited to lower temperatures (<40 K), low bending strains (<0.2%) and low magnetic fields (<2–3 T). Another subtler disadvantage of this approach is the use of a substrate with planer (i.e. flat) geometry. Substrates with planer (flat) geometry suffer from two inherent disadvantages. First, they have higher eddy current loss when a magnetic field is applied perpendicular the face of the tape. This situation is unavoidable in many applications. Second, they generate a non-uniform self magnetic field. This will result in non-uniform current distribution in the superconducting material. Non-uniform current distributions result in an inefficient current flow, and thus, an uneconomical use of the superconducting material.

Coated Conductors

The second generation HTS conductors under development usually employ a RABITS or IBAD type technology.

These second-generation conductors have the advantage of using the Re—Ba—Cu—O materials, which have better intrinsic superconducting properties over the Bi-oxide materials. The Re—Ba—Cu—O materials can operate (i.e. carry more current) at higher temperatures and higher magnetic fields than the Bi-oxide materials. There are still significant disadvantages to these approaches. First, they cannot yet be fabricated in long lengths. To date, lengths are still limited to the 1–2 meter range. Conductors demonstrating the best critical current densities (Jc) are limited to just a few centimeters. In addition, this approach is still limited to very thin films. Thus, while the current density (J) can be quite high $>10^5$ A/cm$^2$, the actual current (I) is still quite low. Another major disadvantages to these two approaches are the metallic substrate material itself. The substrates are heavy, thick compared to the HTS deposited film, costly to implement, often magnetic in nature, and require several buffer layers for suitable lattice matching to the superconducting material. These substrates also have a flat geometry and are thus limited by self magnetic field effects and ac losses. Finally, the last major disadvantage to RABITS and IBAD approaches are economic. These approaches require many processing steps and are materials and equipment intensive. The technical feasibility and economic viability of the approach is still not well understood.

Related Patents

U.S. Pat. No. 5,093,880

There are two patents relevant to the submitted patent application. The first is by Matsuda et al. (U.S. patent Ser. No. 5,093,880) submitted by Furukawa Electric Co., Ltd. entitled "Optical Fiber Cables Comprising Carbon-and Metal-Coated Optical Fibers and their Manufacture." The similarity of this patent is in the use of optical fibers with noble metallic and carbon coatings. An electroplating process is used to deposit the metallic coatings on the optical fibers. The primary difference in the patent submitted here and that of Matsuda et al. (U.S. Pat. No. 5,093,880) is that their coating is not a superconductive coating. The fibers of Matsuda et al. will not display superconducting properties and thus will not have the ability to transmit dc electrical current with zero resistance.

Patent No. JP 63299011

The second existing patent (Patent Serial No. JP 63299011) related to the patent submitted here is that of Kyofuji and Masahiro of Hitachi Cable Co. entitled 'Optical Fiber Coated with Oxide Ceramic Superconductor'. There are Four main differences between the patent of Kyofuji and Masahiro and the patent submitted here. The properties of the optical fiber are an absolute necessity in the production of the superconducting phase of the coating. It is the high temperature capability and glass-like property of the optical fiber, which provides the necessary substrate material for the formation of the superconducting phase. Furthermore, it is the mechanical properties of the optical fiber (see Objects and Advantages) which provide its durability and practicality. Finally, it is the potential dual use of both the optical fiber as a superconducting fiber for the transmission of dc electrical current without losses and a standard optical fiber for the transmission of data optically (e.g. telecommunications) which can provide the adequate economic incentive for the commercialization of the technology.

First the patent of Kyofuji, Masahiro (Patent Serial No. JP 63299011) is that their patent does not address the use of a buffer layer or layers in the formation of the superconducting phase of the material. It is well established that the use of buffer layers in most HTS materials (in particular Re—Ba—Cu—O) is necessary to promote good grain alignment and the necessary lattice parameter matching between superconducting material and substrate The introduction of defects into buffer layers can also be used as potential pinning centers. Lattice parameter matching, increasing the grain alignment, providing grain nucleation centers, and increasing the flux pinning strength are necessary requirements to promote increased electrical current transmission. All of these requirements for practical HTS and LTS superconductors are addressed in the use of buffer layers.

The second main difference between the patent of Kyofuji, Masahiro (Patent Serial No. JP 63299011) is that their patent relates to a particular thick film deposition technique involving a superconducting paste. The submitted patent does not restrict itself to any single coating technique. The uniqueness of the optical fiber (see Objects and Advantages) allows for many potential thick and thin film coating techniques. The patent of Matsuda et al. is a prime example of the ease of which optical fibers are coated with noble metals using a plating process. Furthermore, thin film techniques (e.g. rf/dc sputtering CVD, MOCVD, laser ablation, etc.) have demonstrated outstanding grain alignment and superconducting phase formation far superior to thick film techniques.

Finally, the third main difference between the submitted patent and patent No. JP 63299011 is the restriction to HTS materials for JP 63299011. The submitted patent applies to both LTS and HTS materials. In particular, the deposition A-15 type LTS materials (e.g. Nb—Sn, Nb—Al, Nb—Ge, etc.) on optical fibers could be particularly useful. LTS A-15 materials, have many of the disadvantages of their HTS counterparts. They require high temperature processing for superconducting phase formation, are brittle, have low bending strains, and are costly to prepare. For practical applications, because of their brittle nature, A-15 LTS materials often require the use of a wind then react technique. The use of a fiber capable of withstanding the high temperature processing, such as an optical fiber, while remaining chemically inert will have many practical advantages (see Objects and Advantages).

OBJECTS AND ADVANTAGES

General Advantages

The uniqueness of this invention is the use of a low cost, light-weight, mechanically rugged, fiber capable of withstanding the high temperature required during the fabrication of long length HTS (>800 degrees C) and LTS (>600 degrees C) material. Previous substrates for long length "bulk" conductors have concentrated on flat metallic materials (e.g. copper, silver, silver alloys, nickel alloys, etc.). In "thin film" HTS superconducting research, dielectric substrates (e.g. SrTiO2, MgO, YSZ, LaAlO3, sapphire, etc.) have demonstrated outstanding current carrying capacities. The ongoing challenge has been to couple the benefits of epitaxial growth on dielectric substrates with a process suitable for long length low cost wire fabrication. Specifically for HTS material, this technique can be applied to any of the recently discovered HTS conductors. These HTS materials include (but are not limited to) some of the following: Re—Ba—Cu—O, where Re is defined as rare earth materials, La—Ba—Cu—O, La—Sr—Ca—Cu—O, Bi—Sr—Ca—Cu—O, Bi—Pb—Ca—Ba—Cu—O, Tl—Ba—Ca—Cu—O, Tl—Pb—Ba—Ca—Cu—O, Hg—Ba—Ca—Cu—O, etc. The use of optical fibers as substrates can also be applied to Low Temperature Superconductors (LTS), in particular to A-15 materials, which require high temperature processing. These LTS materials include (but are not limited to) some of the following: Nb—Sn, Nb—Al, Nb—Ti—Sn, Nb—Ta—Sn, Nb—Ge, etc.

Another unique aspect of this invention is the ability of the substrate (optical fiber) to readily accept a buffer layer(s) or barrier layer(s). Buffer layers can be used to promote lattice matching, epitaxial growth and good grain alignment. This can lead to improved current carrying capability. Buffer layer materials include (are not limited to) Cerium Oxide (CeO), Yitria Stabilized Zirconia (YSZ), and Ruthenium Oxide (RuO). Barrier layers are used in device fabrication and can include (but are not limited to) the following: Pr—Ba—Ca—Cu—O, oxygen deficient Re—Ba—Ca—Cu—O, etc.

Specific Advantages

Figure 2:
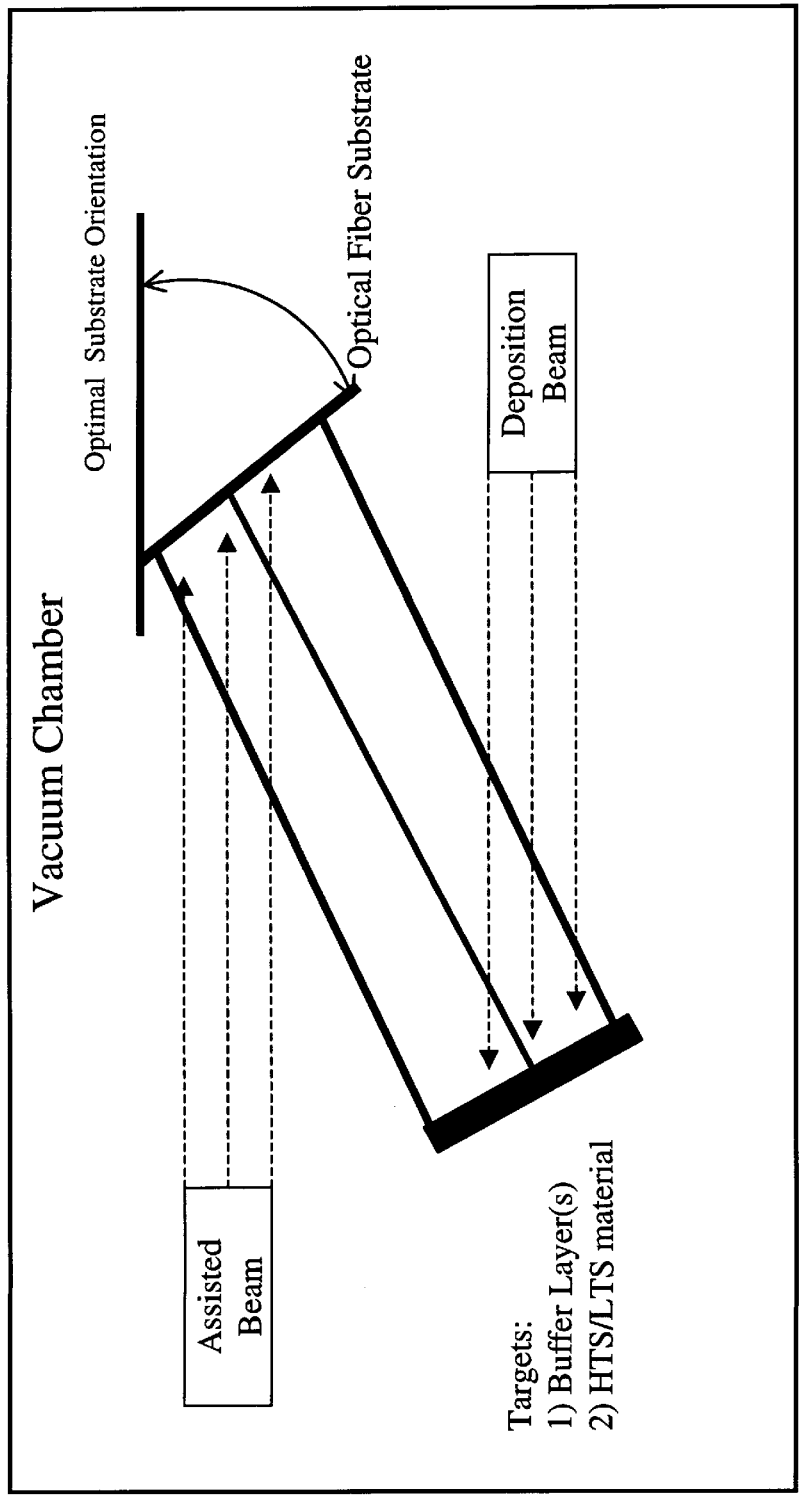
FIG. 2
Figure 3:
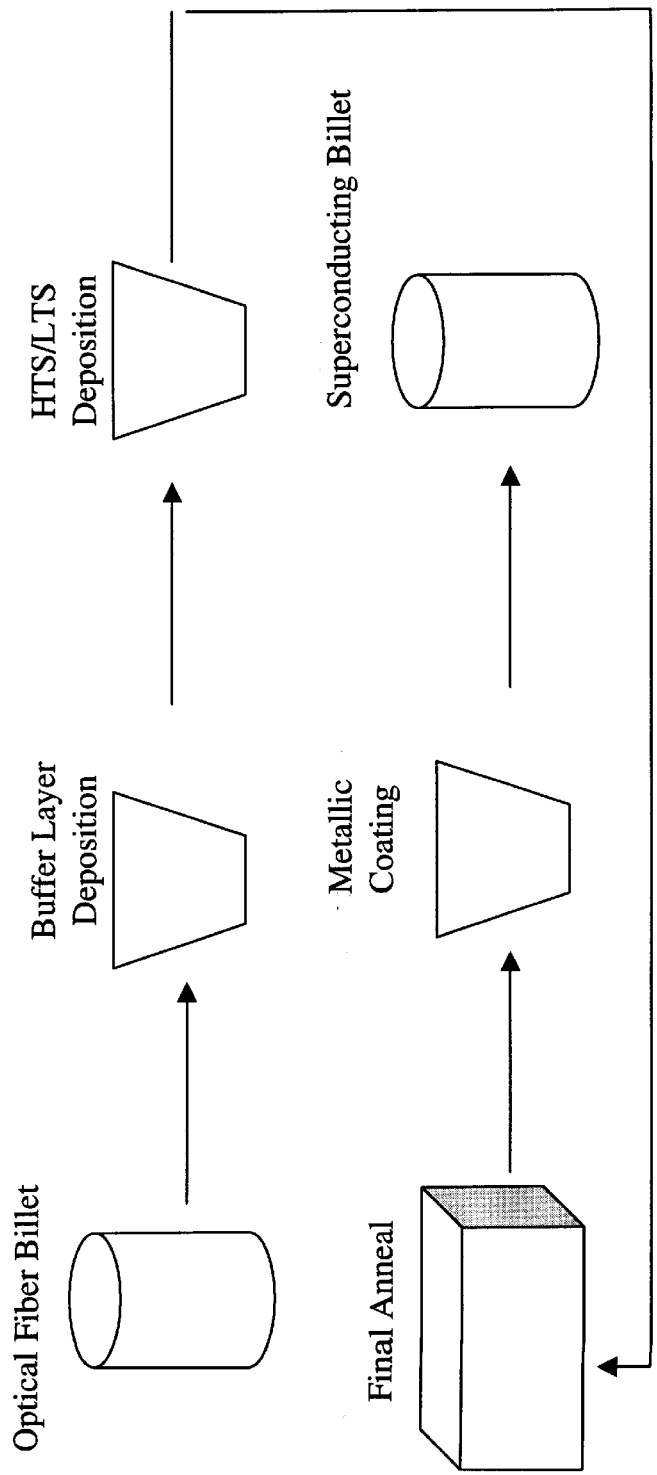
FIG. 3

The alternative approach submitted under Invention Disclosure OIPE No. 67366 employs a new and different type of substrate. This approach uses an optical fiber as the underlying substrate material. The novel advantage of this approach is that it couples the outstanding electrical properties of HTS thin film techniques on dielectric substrates with the practical and economic necessity for long length wire production. There are several advantages to the optical fiber approach over traditional approaches.

a) First, the glass-like nature of the optical fibers and their ability to withstand the high reaction temperatures(>600 degrees C for LTS and >800 degrees C for HTS) during the formation of the superconducting phase, while remaining chemically inert, is desirable.

b) Second, optical fibers, typically made of quartz, can be readily coated with various types of buffer layers. Buffer layers can lead to good lattice matching between the superconductor and the substrate, which can promote the epitaxial growth of the superconducting material and reduce intrinsic strain. Both of these effects can in turn lead to enhanced current carrying capacity. In addition, defects and seeding, which promote flux pinning and grain site nucleation, can be readily introduced into the substrate or buffer layers. Increasing the flux pinning strength and providing nucleation centers will have a positive impact on current carrying ability of the wire (see FIG. 1).

c) Third, barrier layers, which are used in the tunneling of electrons, can also be readily deposited at high temperature. Barrier layers are necessary for some superconducting electrical device fabrication.

d) Fourth, the nature of the optical fibers allow many thick and thin film techniques to be applied quite readily to the fabrication process (for example see FIGS. 2 and 3). Suggested deposition processes may include (but are not limited to) some of the following techniques: rf/dc sputtering, chemical and plasma vapor deposition, spray pyrolysis, electroplating, laser ablation, lithographic techniques, sol-gel, thick film paste, dip coating, etc.

e) Fifth, optical fibers have many practical advantages over existing substrates now being investigated. They are extremely mechanically rugged, non-magnetic, light-weight, with relatively high tensile strengths and bending strains. This will introduce greater practicality in the fabrication of commercial devices. This in turn will reduce the fabrication cost and promote greater commercial viability.

f) Sixth, superconducting wires made with optical fiber substrates can have significantly lower losses when used in ac applications. The reasons are as follows: 1) the electrically insulating nature of the optical fiber substrate can minimize eddy current loss; 2) optical fibers can be readily made with very small cross sections (approximately a few microns). Hysteresis loss is proportional to the superconductor filament diameter, hence the smaller the diameter, the smaller the hysteresis loss; 3) optical fibers have circular symmetry. Substrates with circular symmetry have uniform self magnetic field when transmitting current. A uniform self field translates to a uniform current distribution and thus an efficient use of superconducting material.

g) Seventh, optical fibers have a demonstrated ability to be cabled into large bundles. For superconducting applications, this would translate to increased current carrying capacity. Transposed wire bundles would be necessary for ac applications.

h) Eighth, the fibers can readily be coated with noble metallic materials (such as copper, silver or gold, etc.) for electric and thermal stability. In addition, they can also be readily coated with a dielectric material for electrical insulation and environmental protection (see FIG. 1).

I) Ninth, the possibility of plurality use of an optical fiber transmitting information (optically) in its traditional role coupled with a superconducting current carrying ability is enticing. A dual role of the optical fiber in this fashion could significantly increase the cost/benefit ratio of such a device.

j) Tenth, these substrates are more economically viable than previously investigated substrates. There is an established infrastructure in industry to support the production and characterization of very low cost optical fibers. These fibers can be made at fractions of a dollar per meter.

It is these advantages that indicate that the use of optical fibers in the production of both LTS and HTS conductors may be beneficial to the worldwide electrical industry

DESCRIPTION OF INVENTION

Figure 4:
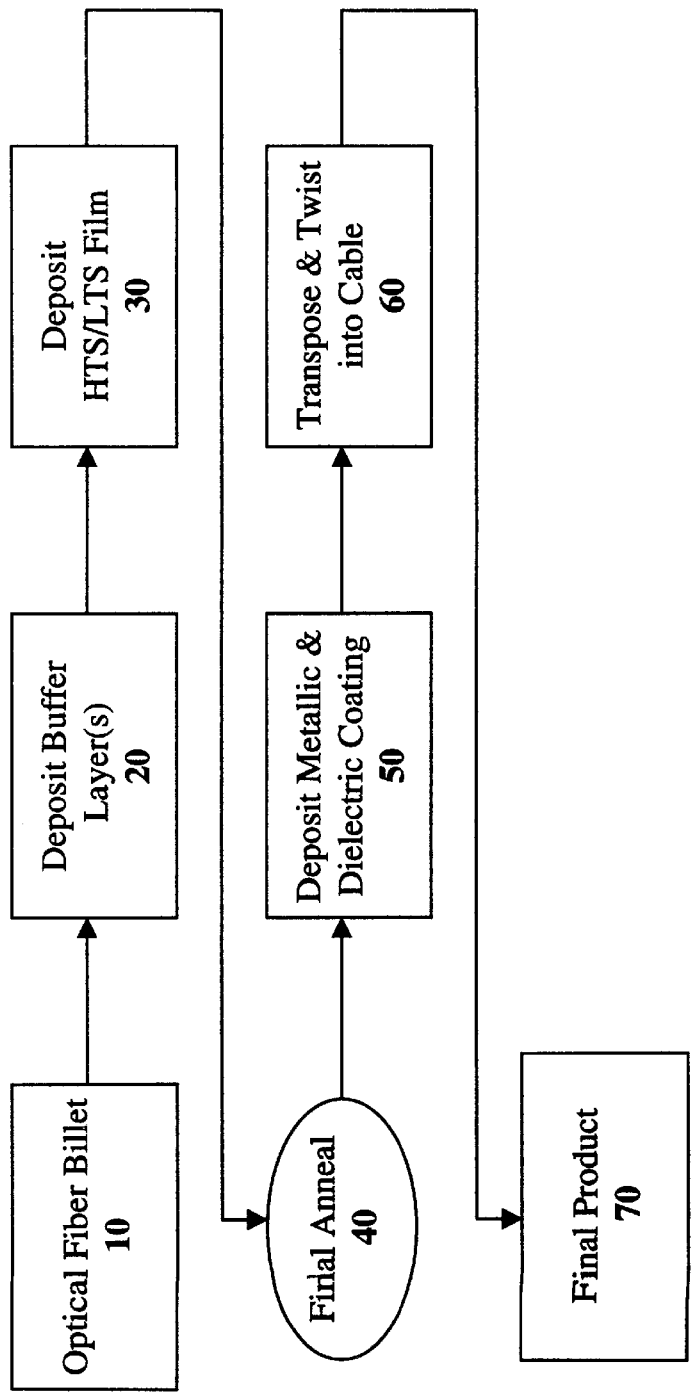
FIG. 4

A typical flow chart of the fabrication process of the present invention is illustrated in FIG. 4. The process begins with the introduction of the optical fiber billet 10. The billet consists of fully characterized optical fiber of uniform cross section. In the next step of the process 20, a buffer layer(s) is then deposited in a controlled environment (i.e. temperature, pressure, chemical species present, etc.) on the optical fiber to enhance grain growth. Next 30, the LTS or HTS material is deposited in a controlled environment (i.e. temperature, pressure, chemical species present, etc.). Next, the optical fibers may then undergo a final anneal 40. The last processing step 50, is the introduction of a noble metallic material for electric and thermal stability and/or a dielectric material for electrical insulation and environmental protection. The post-processed wire is then transposed, twisted and cabled 60 into multi-strand conductor. The final step 70 is the installation of the cable for device fabrication. The post-processed optical fiber may have a plural use as both traditional optical fiber used in optical data transmission and/or a superconducting wire for electrical current carrying devices.

What is claimed is:

1. A superconducting wire or cable comprising:
   a crystalline or amorphous optical fiber,
   a thin film buffer layer or layers deposited on the fiber, and
   a thin film low temperature superconducting material deposited on the buffer layer or layers,
   wherein the buffer layer or layers is non-superconducting.

2. The superconducting wire or cable of claim 1, further comprising:
   a noble metallic coating deposited on the wire or cable for providing electric and thermal stability to the wire or cable.

3. The superconducting wire or cable of claim 1, further comprising:
   an outer dielectric coating deposited on the wire or cable for providing electrical insulation and environmental protection to the wire or cable.

4. A superconducting wire or cable comprising:

a crystalline or amorphous optical fiber, a thin film low temperature superconducting material deposited on the fiber.

5. The superconducting wire or cable of claim 4, further comprising:

a noble metallic coating deposited on the wire or cable for providing electric and thermal stability to the wire or cable.

6. The superconducting wire or cable of claim 4, further comprising:

an outer dielectric coating deposited on the wire or cable for providing electrical insulation and environmental protection to the wire or cable.

7. A superconducting wire or cable comprising:

a crystalline or amorphous optical fiber, an epitaxially grown thin film crystalline buffer layer or layers deposited on the fiber, and an epitaxially grown thin film crystalline high temperature superconducting material deposited on the buffer layer or layers, wherein the crystal lattice constant of the buffer layer closely matches the crystal lattice constant of the high temperature superconducting material and the buffer layer or layers is non-superconducting.

8. The superconducting wire or cable of claim 7, further comprising:

a noble metallic coating deposited on the wire or cable for providing electric and thermal stability to the wire or cable.

9. The superconducting wire or cable of claim 7, further comprising:

an outer dielectric coating deposited on the wire or cable for providing electrical insulation and environmental protection to the wire or cable.

* * * * *